(12) United States Patent
Vukovic et al.

(10) Patent No.: US 8,048,226 B2
(45) Date of Patent: Nov. 1, 2011

(54) METHOD AND SYSTEM FOR IMPROVING DEPOSITION UNIFORMITY IN A VAPOR DEPOSITION SYSTEM

(75) Inventors: Mirko Vukovic, Slingerlands, NY (US); James Grootegoed, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 234 days.

(21) Appl. No.: 11/694,312

(22) Filed: Mar. 30, 2007

(65) Prior Publication Data
US 2008/0236497 A1 Oct. 2, 2008

(51) Int. Cl.
*C23C 16/00* (2006.01)
(52) U.S. Cl. ............... 118/715; 156/345.33; 156/345.34; 216/58; 428/66.4; 222/1; 222/3; 137/2
(58) Field of Classification Search .................. 118/715; 156/345.33, 345.34; 137/2; 216/58; 222/1, 222/3
See application file for complete search history.

(56) References Cited

U.S. PATENT DOCUMENTS

| | | | | |
|---|---|---|---|---|
| 5,711,815 | A * | 1/1998 | Lee et al. ..................... | 118/725 |
| 5,884,009 | A * | 3/1999 | Okase ........................... | 392/418 |
| 6,022,414 | A * | 2/2000 | Miller et al. .................. | 118/718 |
| 6,206,976 | B1 * | 3/2001 | Crevasse et al. .............. | 118/720 |
| 6,270,634 | B1 * | 8/2001 | Kumar et al. .............. | 204/192.37 |
| 6,702,900 | B2 * | 3/2004 | Yeh et al. ..................... | 118/730 |
| 6,793,733 | B2 * | 9/2004 | Janakiraman et al. ........ | 118/715 |
| 6,806,211 | B2 * | 10/2004 | Shinriki et al. ................ | 438/785 |
| 7,064,812 | B2 * | 6/2006 | Ludviksson et al. ............ | 356/72 |
| 2004/0099216 | A1 * | 5/2004 | Koh et al. ............... | 118/723 CB |
| 2004/0261946 | A1 * | 12/2004 | Endoh et al. .............. | 156/345.15 |

FOREIGN PATENT DOCUMENTS

JP 2002-217171 * 8/2002

* cited by examiner

*Primary Examiner* — Ram Kackar
*Assistant Examiner* — Satish Chandra
(74) *Attorney, Agent, or Firm* — Oblon, Spivak, McClelland, Maier & Neustadt, L.L.P.

(57) ABSTRACT

A processing system for treating a substrate includes a process chamber, a substrate holder, a gas distribution system, and a flow modulation element. The process chamber has a pumping system to evacuate the process chamber. The substrate holder is coupled to the process chamber and supports the substrate. The gas distribution system is coupled to the process chamber. The gas distribution system introduces a process gas to a process space above an upper surface of the substrate. The flow modulation element is coupled to the substrate holder beyond a peripheral edge of the substrate. The flow modulation element includes one or more gas distribution openings that introduce an additive process gas beyond the peripheral edge of the substrate in a direction substantially away from the substrate. The additive process gas has a directional component substantially parallel to the upper surface of the substrate.

20 Claims, 8 Drawing Sheets

METHOD AND SYSTEM FOR IMPROVING DEPOSITION UNIFORMITY IN A VAPOR DEPOSITION SYSTEM

CROSS-REFERENCE TO RELATED APPLICATIONS

This application is related to pending U.S. patent application Ser. No. 11/684,853, entitled "DYNAMIC CONTROL OF PROCESS CHEMISTRY FOR IMPROVED WITHIN-SUBSTRATE PROCESS UNIFORMITY", filed on Mar. 12, 2007. The entire contents of this application is herein incorporated by reference in its entirety.

BACKGROUND OF THE INVENTION

1. Field of the Invention

The present invention relates to a method and system for thin film deposition, and more particularly to a method and system for uniformly depositing a thin film using chemical vapor deposition (CVD).

2. Description of Related Art

During material processing, such as semiconductor device manufacturing for production of integrated circuits (ICs), vapor deposition is a common technique for forming thin films, as well as conformal thin films over and within complex topography, on a substrate. Vapor deposition processes can include chemical vapor deposition (CVD) and plasma enhanced CVD (PECVD). For example, in semiconductor manufacturing, such vapor deposition processes may be used for gate dielectric film formation in front-end-of-line (FEOL) operations, and low dielectric constant (low-k) or ultra-low-k, porous or non-porous, dielectric film formation and barrier/seed layer formation for metallization in back-end-of-line (BEOL) operations, as well as capacitor dielectric film formation in DRAM production.

In a CVD process, a continuous stream of film precursor vapor is introduced to a process chamber containing a substrate, wherein the composition of the film precursor has the principal atomic or molecular species found in the film to be formed on the substrate. During this continuous process, the precursor vapor is chemisorbed on the surface of the substrate while it thermally decomposes and reacts with or without the presence of an additional gaseous component that assists the reduction of the chemisorbed material, thus, leaving behind the desired film.

In a PECVD process, the CVD process further includes plasma that is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD.

SUMMARY OF THE INVENTION

A method and system is provided for treating a substrate. For example, the method and system may be configured to deposit a thin film using chemical vapor deposition (CVD).

According to one exemplary embodiment, a processing system for treating a substrate is described, comprising: a process chamber having a pumping system configured to evacuate the process chamber; a substrate holder coupled to the process chamber and configured to support the substrate; a gas distribution system coupled to the process chamber, wherein the gas distribution system is configured to introduce a process gas to a process space above an upper surface of the substrate; and a flow modulation element coupled to the substrate holder beyond a peripheral edge of the substrate, wherein the flow modulation element comprises one or more gas distribution openings configured to introduce an additive process gas beyond the peripheral edge of the substrate in a direction substantially away from the substrate and having a directional component substantially parallel to the upper surface of the substrate.

According to another exemplary embodiment, a method for supplying process gas to a substrate processing system for treating a substrate is described, comprising: introducing a process gas through a gas distribution system coupled to the substrate processing system and configured to oppose the substrate on a substrate holder such that a flow of the process gas is directed towards the substrate; and introducing an additive process gas through a flow modulation element coupled to the substrate holder and configured to introduce the additive process gas beyond a peripheral edge of the substrate, wherein the introducing of the additive process gas is in a direction substantially away from the substrate and having a directional component substantially parallel to an upper surface of the substrate.

DETAILED DESCRIPTION OF PREFERRED EMBODIMENTS

Figure 1:
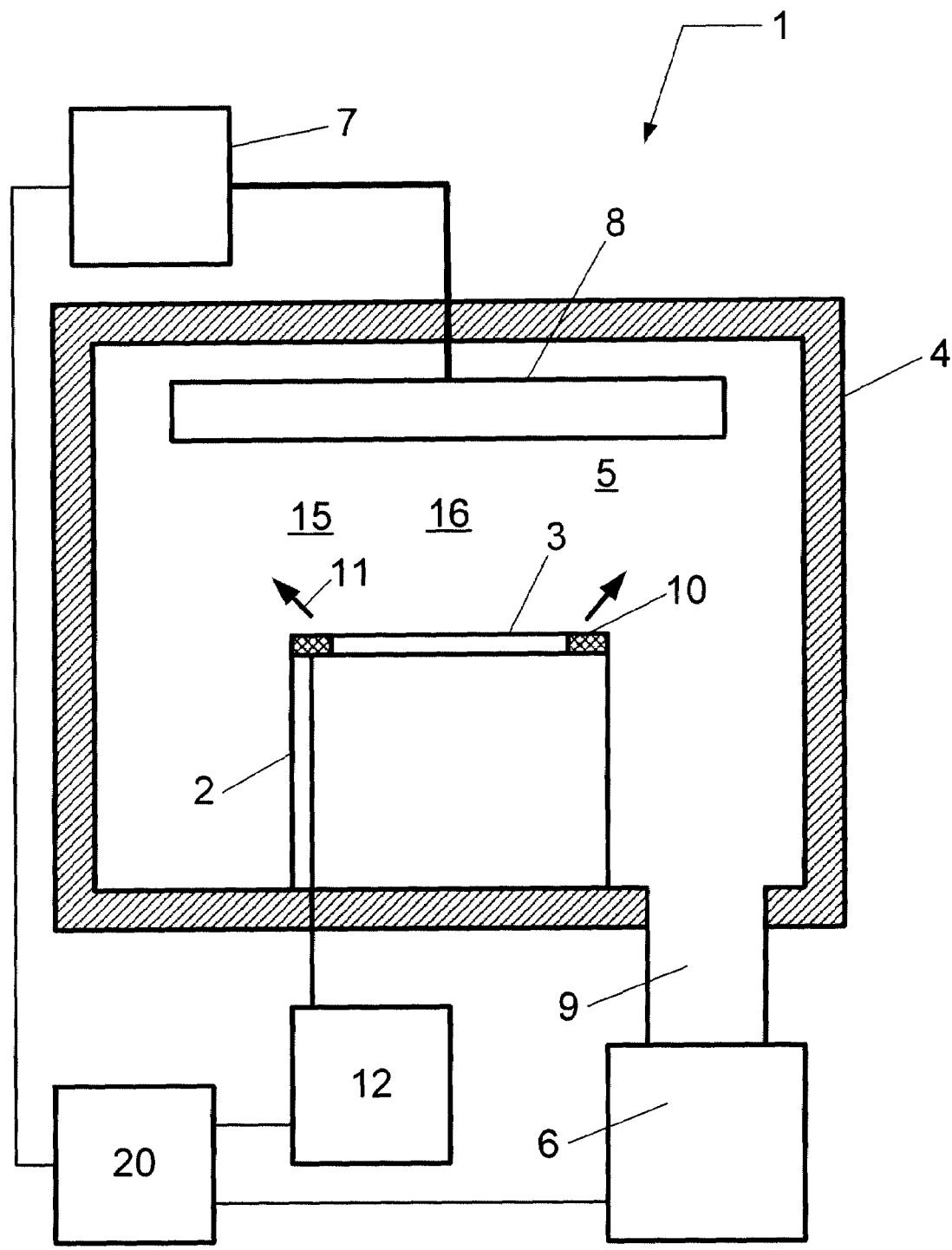
FIG. 1 depicts a schematic view of a deposition system according to an exemplary embodiment.

In the following description, in order to facilitate a thorough understanding of the exemplary embodiments and for purposes of explanation and not limitation, specific details are set forth, such as a particular geometry of the substrate processing system and descriptions of various components. However, a person of ordinary skill in the art would understand that the invention may be practiced in other embodiments that depart from these specific details.

The substrate processing system can comprise a vapor deposition system that may or may not utilize plasma to assist the deposition process. For instance, the substrate processing system may comprise a vapor deposition system, such as a chemical vapor deposition (CVD) system or a plasma enhanced CVD (PECVD) system, to facilitate a deposition process during semiconductor manufacturing.

Often times, in such vapor deposition systems, process gases, including film forming gases, reduction gases, dilution gases, etc., are introduced to the processing system through a gas injection system. According to one example, process gases enter the processing system through a shower head gas distribution plate positioned above and opposite the substrate. As the process gases enter the process space above the substrate, they eventually turn and flow radially outward across the substrate. According to another example, process gases enter the processing system through the side of the processing system and flow horizontally across the substrate from one side of the processing system to the other side of the processing system. In either case, when the background pressure facilitates a sufficient number of collisions between atomic/molecular species in the process gas, a momentum boundary layer can form adjacent to the surface of the substrate. Moreover, due to differences in temperature and composition between the passing process gas and the substrate, a thermal boundary layer and a concentration boundary form as well.

In order to evacuate the vapor deposition system, a vacuum pumping system is utilized to remove gaseous effluent, whereby the vacuum pumping system can be located directly below the substrate, or off to the side of and below the substrate. Due to the finite radius or length of the substrate holder supporting the substrate, the flow of process gas bends over the edge of the substrate holder in a direction of the vacuum pump and pinches the momentum boundary layer. This narrowing of the boundary layer arising from the acceleration of the flow of process gas over the edge of the substrate can lead to differences in the mass transport and thermal transport across the boundary layer proximate to the edge of the substrate relative to near the center of the substrate.

According to one exemplary embodiment, one or more flow modulation elements are utilized to adjust the flow of process gases proximate to the edge of the substrate relative to the center of the substrate. For example, the one or more flow modulation elements may facilitate perturbing, or inflating the boundary layer such that the flow of process gases over the substrate is more uniform. Nonetheless, the invention can be used for improving uniformity in deposition systems or in other processing systems.

For example, the substrate processing system may include a vapor deposition system such as a chemical vapor deposition (CVD) system, a plasma enhanced CVD (PECVD) system, an atomic layer deposition (ALD) system, a plasma enhanced ALD (PEALD) system, a physical vapor deposition (PVD) system or an ionized PVD (iPVD) system; a dry plasma etching system; a dry non-plasma etching system; a dry cleaning system; an ashing system; a chemical oxide removal (COR) system; a thermal treatment module in a photoresist coating system such as a track system; or a single substrate thermal processing system configured to thermally treat a substrate.

The substrate processing system may be configured to process a substrate of arbitrary shape. A typical substrate may be a circular wafer of various diameters including, but not limited to 200 millimeters (mm), 300 mm, 450 mm, or larger. Additionally, for example, the substrate may be a semiconductor substrate, such as a silicon substrate or SiGe substrate, or a silicon-on-insulator (SOI) substrate. Alternatively, for example, the substrate may have a rectangular shape, such as a flat panel or liquid crystal display (LCD).

Referring now to the drawings, wherein like reference numerals designate identical or corresponding parts throughout the several views, FIG. 1 schematically illustrates a deposition system 1 for depositing a thin film, such as a conductive film, a non-conductive film, or a semi-conductive film. For example, the thin film can include a metal-containing film, such as a metal, metal oxide, metal carbide, metal nitride, metal carbonitride, metal silicate, or metal silicide, for use as a barrier layer, seed layer, gate dielectric layer, or gate electrode layer. Alternatively, for example, the thin film can include a dielectric film, such as a low dielectric constant (low-k) or ultra-low-k dielectric film, for use as a inter-/intra-connect insulation layer. The deposition system 1 can include a chemical vapor deposition (CVD) system, whereby a film forming composition is thermally activated or decomposed in order to form a film on a substrate.

The deposition system 1 comprises a process chamber 4 having a substrate holder 2 configured to support a substrate 3, upon which the thin film is formed. Furthermore, the substrate holder 2 is configured to control the temperature of the substrate at a temperature suitable for the film forming reactions using a temperature control system (not shown).

The process chamber 4 is coupled to a process gas supply system 7 configured to introduce a film forming composition to a process space 5 in the process chamber 4 through a gas distribution system 8. For example, the gas distribution system 8 can include a showerhead gas distribution system having a gas distribution assembly and a gas distribution plate coupled to the gas distribution assembly and configured to form a gas distribution plenum therein. Although not shown, the gas distribution plenum can comprise one or more gas distribution baffle plates configured to distribute process gas evenly behind the gas distribution plate. The gas distribution plate further comprises a plurality of gas distribution orifices to distribute the process gas from the gas distribution plenum to the process space 5 within the deposition system 1.

The process chamber 4 is further coupled to a vacuum pumping system 6 through a duct 9, wherein the pumping system 6 is configured to evacuate the process chamber 4 to a pressure suitable for forming the thin film on the substrate 3.

The process gas flows from the process gas supply system 7 into the process chamber 4 via the gas distribution system 8. The gas flows past the substrate 5 and then exits the process chamber through the duct 9 due to the pumping system 6.

The process gas supply system 7 can include one or more material sources configured to introduce a film forming composition to the gas distribution system 8. For example, the film forming composition may include one or more gases, or one or more vapors formed in one or more gases, or a mixture of two or more thereof. The process gas supply system 7 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

The film forming composition can, for example, include a film precursor, a reducing agent, or a polymerization agent, or a combination of two or more thereof. Furthermore, the film forming composition can include an inert gas, a carrier gas or a dilution gas. For example, the inert gas can include a noble gas, i.e., He, Ne, Ar, Xe, or Kr.

As described earlier, the uniformity of process results across the substrate 3 are affected by spatial variations in the momentum, thermal, or concentration boundary layers, or a combination of two or more thereof. Inherent to the gas distribution system 8 and the substrate holder 2 described above, the corresponding flow conditions between and around these structures cause the boundary layer to narrow towards the edge of the substrate 3 and intensify the gradients in velocity, temperature and mass concentration.

Figure 2A:
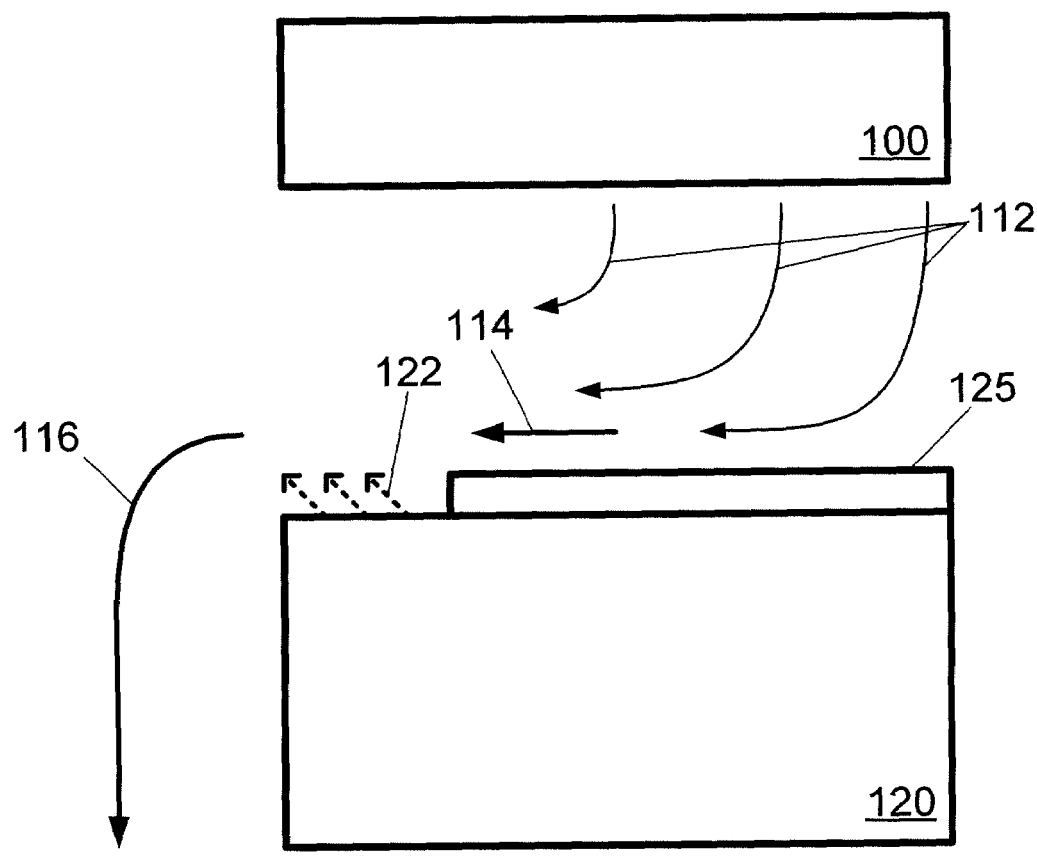
FIGS. 2A, 2B, 2C, and 2D depict cross-sectional views of a substrate holder according to different exemplary embodiments.

Therefore, FIG. 2A depicts a flow modulation element according to an exemplary embodiment. As shown in FIG. 2A, a flow of process gas 112 issues from a gas distribution system 100 and flows downward towards a substrate 125 on a substrate holder 120. Eventually, the flow of process gas 112 bends and flows parallel with a surface of the substrate 125 and outward in a radial direction 114 towards the edge of the substrate 125. Thereafter, an exhaust flow 116 bends over the outer edge of the substrate holder 120 and advects towards a pumping system (not shown).

Additionally, as shown in FIG. 2A, a flow modulation element 122 is utilized to adjust the flow of process gas 112 proximate to the edge of the substrate 125 relative to the center of the substrate 125. The flow modulation element 122 introduces an additive flow of process gas to facilitate the injection of mass and tangential momentum into the boundary layer at the edge of the substrate 125. The injection of mass and momentum into the boundary layer may facilitate perturbing, or inflating the boundary layer such that the flow of process gas 112 over the substrate 125 is more uniform.

The flow modulation element 122 comprises one or more openings formed in an upper surface of the substrate holder 120 and beyond a peripheral edge of the substrate 125. Thus, the flow modulation element 122 is located downstream from the substrate 125 with respect to the flow of the process gas 112. The one or more openings can include one or more orifices, or one or more slots, or a combination thereof, wherein each of the one or more openings is configured to introduce the additive process gas with tangential momentum. For example, as illustrated in FIG. 2A, the flux of mass is introduced at the peripheral edge of the substrate 125 by the flow modulation element 122 in a direction substantially away from the substrate 125 and having a directional component that is substantially parallel with the upper surface of the substrate 125. Therefore, in the embodiment shown, the additive process gas is introduced in a downstream direction from the substrate 125. Additionally, the one or more openings may be distributed uniformly or non-uniformly about the peripheral edge of the substrate 125.

The additive process gas can comprise substantially the same composition as the flow of process gas 112 from the gas distribution system 100, or the additive process gas can comprise a different composition than the flow of process gas 112 from the gas distribution system 100. Additionally, the additive process gas can comprise an inert gas, such as a noble gas.

Figure 2B:
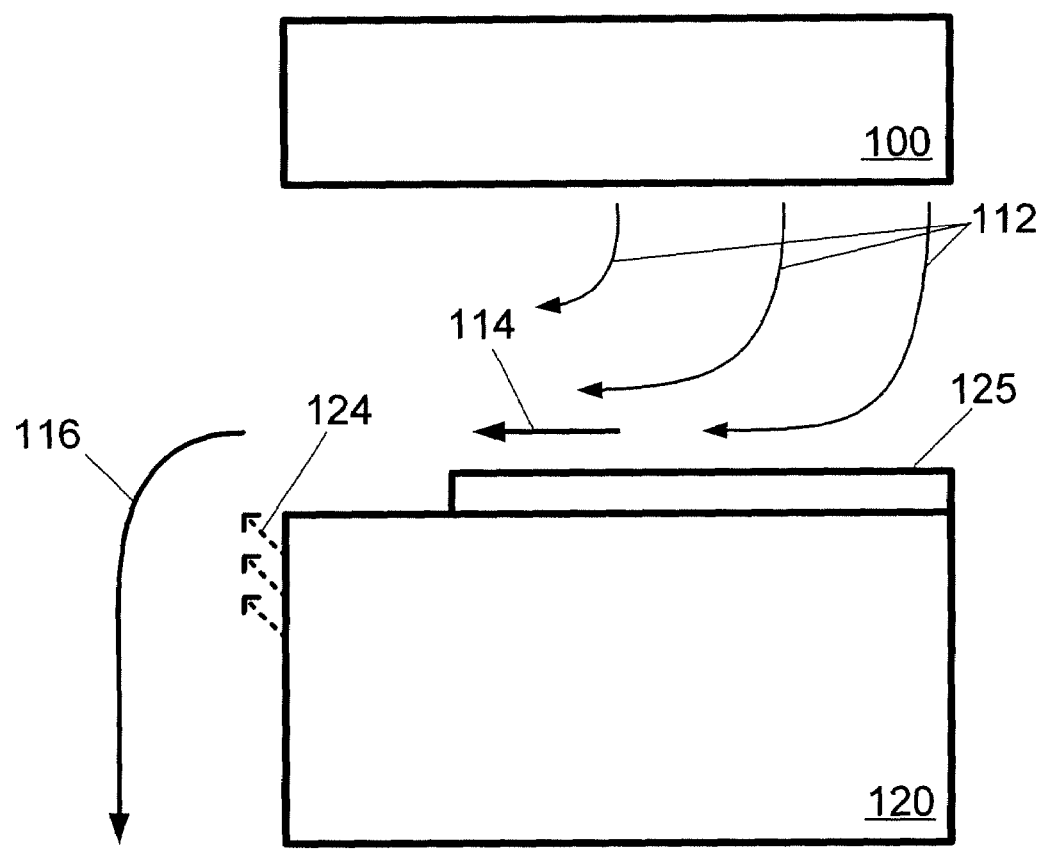

FIG. 2B depicts a flow modulation element according to another exemplary embodiment. As shown in FIG. 2B, a flow modulation element 124 comprises one or more openings formed on an outer edge of the substrate holder 120 and beyond a peripheral edge of the substrate 125. The one or more openings can include one or more orifices, or one or more slots, or a combination thereof, wherein each of the one or more openings is configured to introduce the additive process gas with tangential momentum. For example, as illustrated in FIG. 2B, the flux of mass is introduced at the peripheral edge of the substrate holder 120 by the flow modulation element 124 in a direction substantially away from the substrate 125 and having a directional component that is substantially parallel with the upper surface of the substrate 125. Additionally, the one or more openings may be distributed uniformly or non-uniformly about the peripheral edge of the substrate holder 120.

Figure 2C:
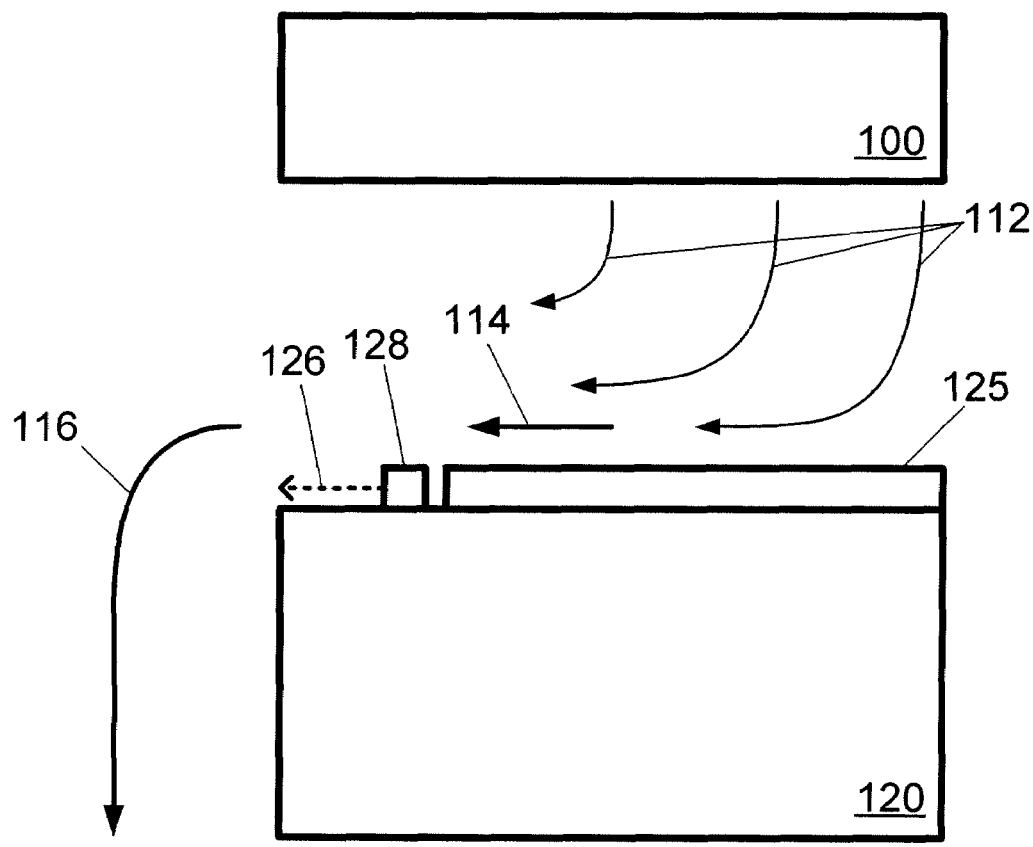

FIG. 2C depicts a flow modulation element according to another exemplary embodiment. As shown in FIG. 2C, a flow modulation element 126 comprises one or more openings formed above an upper surface of the substrate holder 120 and beyond a peripheral edge of the substrate 125. The one or more openings can include one or more orifices, or one or more slots, or a combination thereof, wherein each of the one or more openings is configured to introduce the additive process gas with substantially tangential momentum. For example, as illustrated in FIG. 2C, the flux of mass is introduced at the peripheral edge of the substrate 125 by the flow modulation element 126 from a raised feature 128 in a direction that is substantially away from the substrate 125 and substantially parallel with the upper surface of the substrate 125. For example, the raised feature 128 can include a stepped feature formed on an upper surface of the substrate holder 120, or the raised feature 128 can include a ring resting on an upper surface of the substrate holder 120. Additionally, the one or more openings may be distributed uniformly or non-uniformly about the outer edge of the raised feature 128.

Figure 2D:
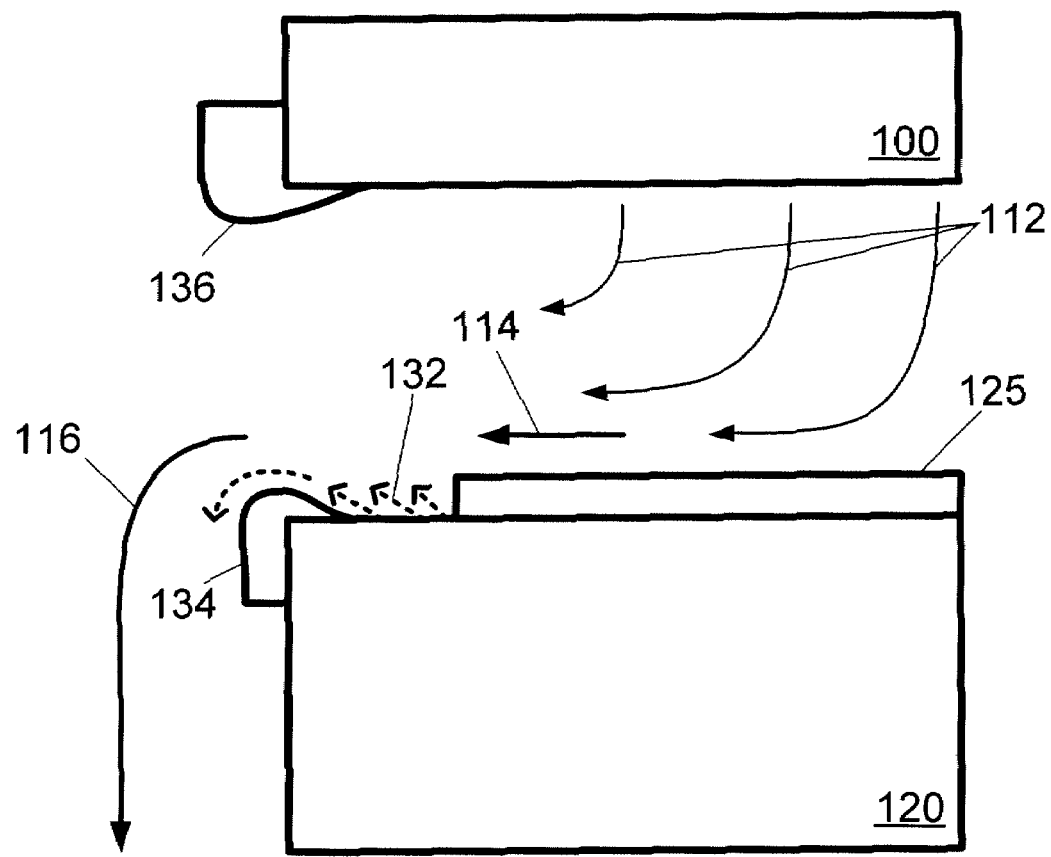

FIG. 2D depicts a flow modulation element according to another embodiment. As shown in FIG. 2D, a flow modulation element 132 comprises one or more openings formed in an upper surface of the substrate holder 120 and beyond a peripheral edge of the substrate 125. The one or more openings can include one or more orifices, or one or more slots, or a combination thereof, wherein each of the one or more openings is configured to introduce the additive process gas with, at minimum, tangential momentum. For example, as illustrated in FIG. 2D, the flux of mass is introduced at the peripheral edge of the substrate 125 by the flow modulation element 132 in a direction substantially away from the substrate 125 and having a directional component that is substantially parallel with the upper surface of the substrate 125. Additionally, the one or more openings may be distributed uniformly or non-uniformly about the peripheral edge of the substrate 125.

Also, as depicted in FIG. 2D, the flow modulation element 132 may be utilized in conjunction with other flow modulation elements. A second flow modulation element 134 can include a solid structure coupled to the substrate holder 120 and configured to perturb or adjust the boundary layer at the peripheral edge of the substrate 125. The second flow modulation element 134 can include a smooth exterior surface configured to contact the flow of process gas 112 and additive process gas, and tailored to displace the boundary layer outward while reducing the probability for separation of the boundary layer from the smooth exterior surface. For example, as illustrated in FIG. 2D, the second flow modulation element 134 can be configured to conform to the outer edge of the substrate holder 120, whereby it is positioned beyond a peripheral edge of both the substrate 125 and the first flow modulation element 132. The precise shape of the second flow modulation element 134 depends on various process parameters for a particular process such as flow rate, process chamber pressure, etc., and can be determined by design of experiments (DOE) or numerical simulation or both. The design of the smooth exterior surface of the second flow modulation element 134 would be understood to a person of ordinary skill in the art of fluid mechanics and boundary layer flows.

Additionally, a third flow modulation element 136 can include a solid structure coupled to the gas distribution system 100 and configured to perturb or adjust the boundary layer at the peripheral edge of the substrate 125. The third flow modulation element 136 can include a smooth exterior surface configured to contact the flow of process gas 112, and tailored to displace the radial flow of process gas 114 downward. The precise shape of the second flow modulation element 134 depends on various process parameters for a particular process such as flow rate, process chamber pressure, etc., and can be determined by design of experiments or numerical simulation or both. The design of the smooth exterior surface of the third flow modulation element 136 would be understood to a person of ordinary skill in the art of fluid mechanics and boundary layer flows. In one embodiment, design of the second flow modulation element 134 and/or the design of the third flow modulation element 136 may optimize the momentum boundary layer adjacent to the surface of the substrate 125 such that the first flow modulation element 132 is not necessary.

Figure 3:
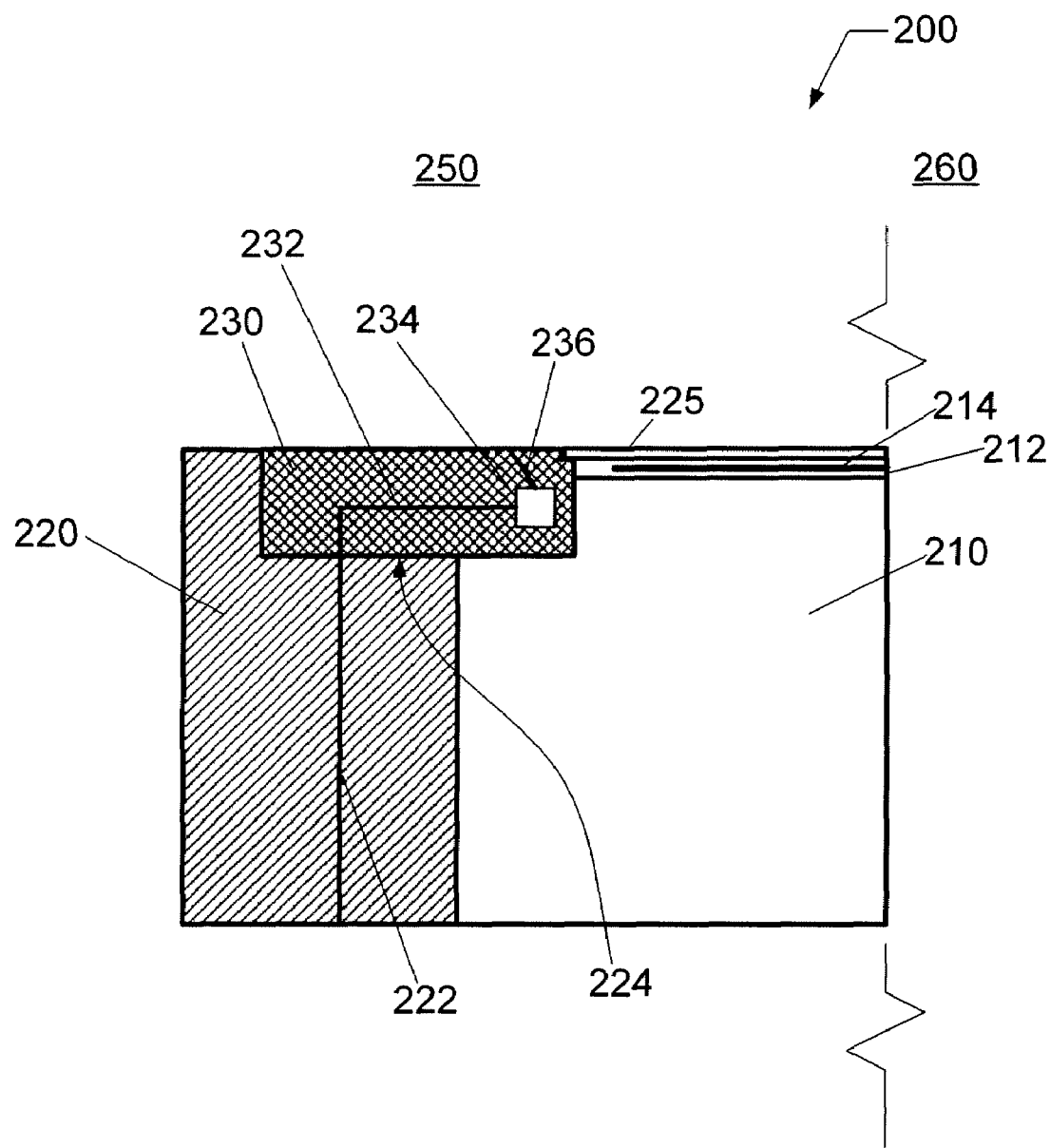
FIG. 3 provides a cross-sectional view of a substrate holder according to another exemplary embodiment.

Referring to FIG. 3, a partial cross-sectional view of a substrate holder is provided according to an exemplary embodiment. A substrate holder 200 comprises an electrode 210, and an insulating member 220 configured to insulate the electrode 210 from an electrical ground member (not shown). For example, the electrode 210 may be coupled to a radio frequency (RF) power source. The substrate holder 200 may include an electrostatic chuck (ESC) having an electrostatic clamp electrode 214 embedded within an ESC ceramic layer 212.

An edge ring 230, comprising an upper surface, a lower surface, an outer surface at an outer diameter and an inner surface at an inner diameter, is coupled to an upper surface of the electrode 210. The inner diameter of the inner surface of the edge ring 230 is sufficiently large to accommodate a substrate 225 and to center the substrate 225 about the axis of revolution of the electrode 210. The substrate 225 comprises an upper surface, a bottom surface, and an outer surface at an outer diameter facing the inner surface of the edge ring 230. The substrate 225 is coupled to the electrode 210 in such a way that the bottom surface of the substrate 225 opposes the upper surface of the electrode 210.

Referring still to FIG. 3, the edge ring 230 is configured to introduce an additive process gas to the process space above the substrate 225, thereby enabling the adjustment of the process boundary layer in a peripheral region 250 of the process space relative to a central region 260 of the process space. The additive process gas is introduced to the edge ring 230 by supplying the gas through a gas supply passage 222 formed in the insulating member 220 to a gas distribution passage 232 formed in the edge ring 230. The coupling of additive process gas can occur at the interface 224 between the insulating member 220 and the edge ring 230. The lower surface of the edge ring 230 and the upper surface of the insulating member 220 that is configured to receive the lower surface of the edge ring 230 may be prepared in a manner that prevents or minimizes the leakage of the additive process gas at the interface 224. For example, the lower surface of the edge ring 230 and the upper surface of the insulating member 220 can be machined to meet high degrees of tolerance on flatness specifications and roughness specifications. Furthermore, the edge ring 230 can comprise an alignment feature configured to mate with a respective feature in the insulating member 220 in order to ensure precise alignment of the gas supply passage 222 and the gas distribution passage 232.

A gas plenum 234 formed within the edge ring 230 receives the additive process gas from the gas distribution passage 232 and distributes the additive process gas to one or more gas injection orifices 236 in the upper surface of the edge ring 230. The gas plenum 234 may extend circumferentially through the edge ring 230. Alternatively, the gas plenum 234 may extend partially in the circumferential direction through the edge ring 230.

Figure 4:
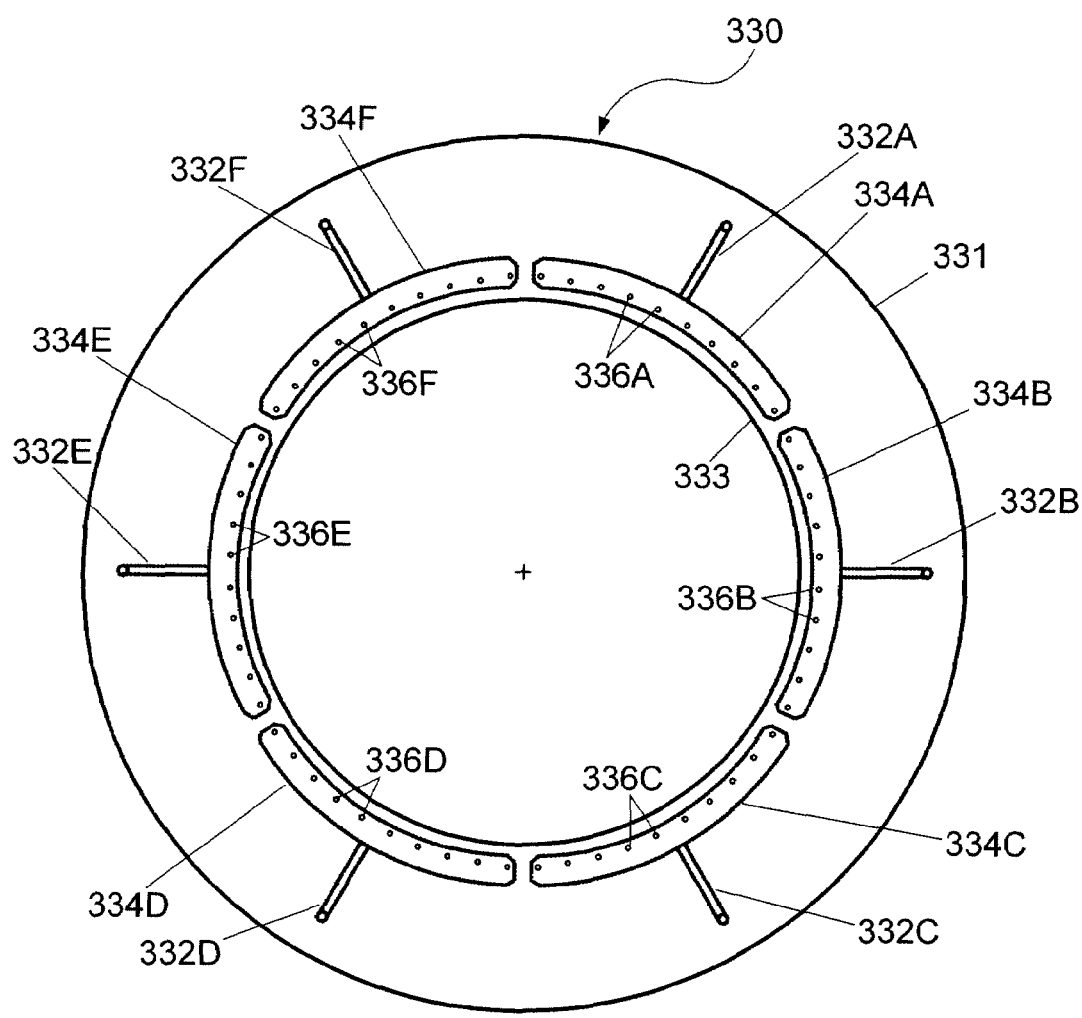
FIG. 4 provides a plan view of an edge ring according to another exemplary embodiment.

Referring now to FIG. 4, a plan view of an edge ring 330 is provided according to another exemplary embodiment. The edge ring 330 comprises an inner edge 333 and an outer edge 331, and a plurality of gas plenums 334A-F positioned between the inner edge 333 and the outer edge 331. The plurality of gas plenums 334A-F are configured to receive a flow of additive process gas from a plurality of gas distribution passages 332A-F and distribute the respective flows of additive process gas to corresponding groups of gas injection orifices 336A-F. Each flow of additive process gas may be independently coupled to each gas distribution passage 332A-F from separate and distinct gas supply passages. Alternatively, each flow of additive process gas may be coupled to each gas distribution passage 332A-F from a common gas supply passage, wherein the plurality of gas distribution passages 332A-F are interconnected within the edge ring 330. The flow rate of additive process gas to each gas plenum (334A-F) or the composition of the additive process gas delivered to each gas plenum (334A-F) or both may be varied. For example, one or more of the flow properties of the additive process gas may be adjusted in order to alter a process result at a peripheral region of the substrate relative to the center region of the substrate. As an additional example, the flow rate of the additive process gas may be adjusted circumferentially around the edge ring 330. For example, the flow rate is increased in the gas distribution passages located close to the pumping system 6 (see FIG. 1) and decreased in the gas distribution passages located further from the pumping system 6.

The edge rings 230 and 330 may be fabricated from a conductive material, a non-conductive material, or a semi-conductive material. Additionally, the edge rings 230 and 330 may include a protective coating formed on a surface thereof. For example, the coating may include a ceramic coating or surface anodization. The edge rings 230 and 330 may be fabricated from quartz, silicon, single crystal silicon, polycrystalline silicon, silicon nitride, silicon carbide, carbon, glassy carbon, alumina, sapphire, aluminum nitride, etc.

Figure 5:
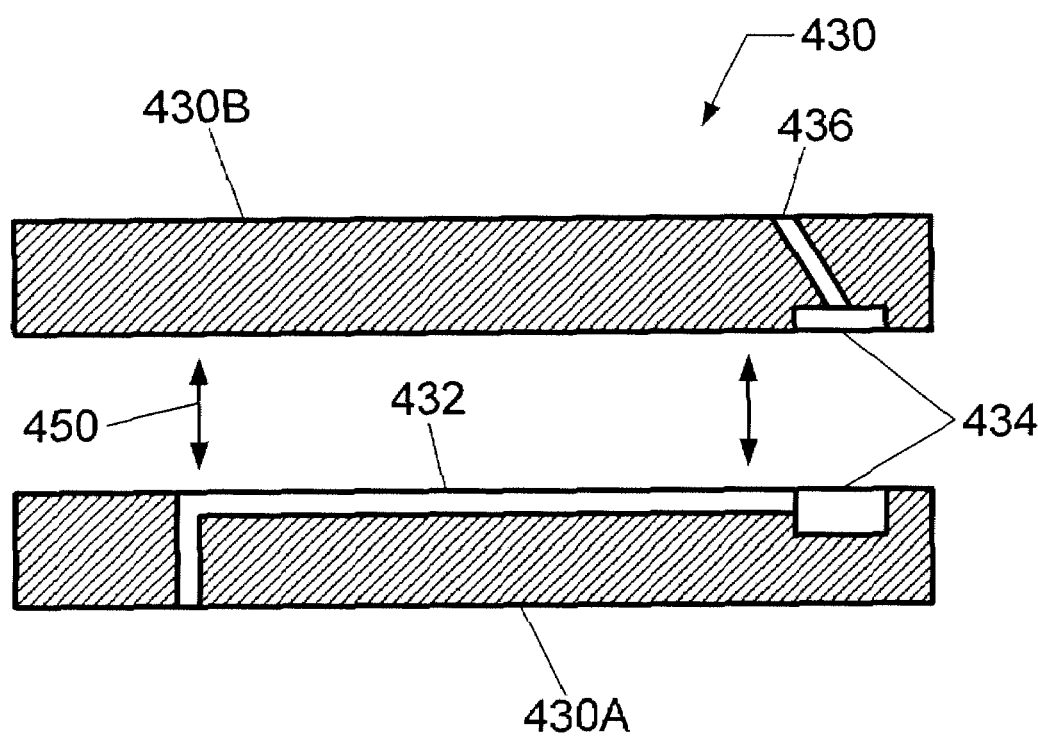
FIG. 5 illustrates a method of manufacturing an edge ring according to another exemplary embodiment.

Referring to FIG. 5, an edge ring 430 may originate in two pieces, an upper portion 430B and a lower portion 430B, wherein a gas distribution passage(s) 432, a gas plenum(s) 434 and a gas injection orifice(s) 436 are machined into the upper portion 430B and the lower portion 430A as illustrated. Following the machining of these features, the upper portion 430B and the lower portion 430A can be bonded to one another using a bonding agent 450. For example, the edge ring 430 (230, 330) may be fabricated from quartz, and the bonding agent 450 can include quartz frit. To manufacture the quartz frit, a dopant is placed in ground quartz to lower its melting temperature. Thereafter, the quartz frit may be suspended within a solvent, such as acetone, and applied to the bonding surfaces of the upper portion 430B and the lower portion 430A using spray coating equipment and masking techniques. Once the frit coating is applied to the bonding surfaces, the upper portion 430B and the lower portion 430A are joined together under mechanical pressure in a kiln and fired at a temperature sufficient to melt the frit. Quartz fusing processes are known to those of ordinary skill in the art of quartz processing.

Referring again to FIG. 1, the substrate holder 2 can further comprise a temperature control system having one or more temperature control elements. The temperature control system can include a heating system, or a cooling system, or both. For example, the substrate holder 2 can include a substrate heating element or substrate cooling element (not shown) beneath the surface of the substrate holder 2. For instance, the heating system or cooling system can include a re-circulating fluid flow that receives heat from the substrate holder 2 and transfers heat to a heat exchanger system (not shown) when cooling, or transfers heat from the heat exchanger system to the table when heating. The cooling system or heating system may include heating/cooling elements, such as resistive heating elements, or thermoelectric heaters/coolers located within the substrate holder 2. Additionally, the heating elements or cooling elements or both can be arranged in more than one separately controlled temperature zone.

Additionally, the upper surface of the substrate holder 2 may be provided with an array of gas ports through which a heat transfer gas, such as helium, can be introduced to, or removed from, the space between the backside of the substrate 3 and the upper surface of the substrate holder 2. The introduction of heat transfer gas to the backside of the substrate 3 facilitates an increase in the thermal conduction between the substrate 3 and the substrate holder 2.

A controller 20 may typically include a microprocessor, a memory, and a digital input/output (I/O) port, potentially including digital/analog (D/A) and/or A/D converters, capable of generating control voltages sufficient to communicate and activate inputs to the deposition system 1 as well as monitor outputs from the deposition system 1. As shown in FIG. 1, the controller 20 can be coupled to and exchange information with the process gas supply system 7, an additive process gas supply system 12 and a vacuum pumping system 9. A program stored in the memory of the controller 20 interacts with the components of the deposition system 1 according to a stored process recipe.

The controller 20 may also be implemented as a general purpose computer, processor, digital signal processor, etc., which causes a thermal treatment assembly to perform a portion or all of the processing steps of the invention in response to the controller 20 executing one or more sequences of one or more instructions contained in a computer readable medium. The computer readable medium or memory is configured to hold instructions programmed according to the teachings of the invention and can contain data structures, tables, records, or other data described herein. One example of the controller 20 may be a general purpose computer such as a DELL PRECISION WORKSTATION 640™, available from Dell Corporation, Austin, Tex. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

The controller 20 may be locally located relative to the deposition system 1, or it may be remotely located relative to the deposition system 1, connected thereto via an internet or intranet. Thus, the controller 20 can exchange data with the deposition system 1 using at least one of a direct connection, an intranet, or the internet. The controller 20 may be coupled to an intranet at a customer site (i.e., a device maker, etc.), or coupled to an intranet at a vendor site (i.e., an equipment manufacturer). Furthermore, another computer (i.e., controller, server, etc.) can access the controller 20 to exchange data via at least one of a direct connection, an intranet, or the internet.

Although only certain exemplary embodiments of this invention have been described in detail above, those of ordinary skill in the art will readily appreciate that many modifications are possible in the exemplary embodiments without materially departing from the novel teachings and advantages of this invention. Accordingly, all such modifications are intended to be included within the scope of this invention.

The invention claimed is:

1. A processing system for treating a substrate, comprising:
a process chamber;
a substrate holder coupled to said process chamber and configured to support the substrate;
a gas distribution system coupled to said process chamber, wherein said gas distribution system is configured to introduce a process gas to a process space above an upper surface of said substrate; and
a pumping system coupled to said process chamber and configured to evacuate said process chamber from below said substrate holder such that a flow of the process gas proceeds radially outward along said surface of the substrate holder;
a flow modulation element coupled to said substrate holder at a position beyond a peripheral edge of said substrate, wherein said flow modulation element comprises a plurality of gas distribution plenums configured to receive a flow of additive process gas from a plurality of gas distribution passages and distribute the respective flows of additive process gas to corresponding groups of gas injection orifices which are provided at said position beyond said peripheral edge of said substrate and configured to introduce a flow of said additive process gas that proceeds in a direction substantially away from said substrate and having a directional component, in a downstream direction from the substrate such that the flow of additive process gas adjusts the flow of process gas along the substrate proximate the edge of the substrate relative to along the substrate proximate a center of the substrate, and
wherein each flow of additive process gas is coupled to each gas distribution passage from separate and distinct gas supply passages provided in the substrate holder.

2. The processing system of claim 1, wherein said flow modulation element is coupled to an upper surface of said substrate holder, and wherein said one or more gas distribution openings are angled in a direction away from said substrate.

3. The processing system of claim 2, wherein said one or more gas distribution openings comprise one or more orifices.

4. The processing system of claim 2, wherein said one or more gas distribution openings are uniformly distributed about said peripheral edge of said substrate.

5. The processing system of claim 2, wherein said one or more gas distribution openings are non-uniformly distributed about said peripheral edge of said substrate.

6. The processing system of claim 1, wherein said flow modulation element is coupled to an outer edge of said substrate holder, and wherein said one or more gas distribution openings are angled in a direction away from said substrate.

7. The processing system of claim 6, wherein said one or more gas distribution openings comprise one or more orifices.

8. The processing system of claim 6, wherein said one or more gas distribution openings are uniformly distributed about said peripheral edge of said substrate.

9. The processing system of claim 6, wherein said one or more gas distribution openings are non-uniformly distributed about said peripheral edge of said substrate.

10. The processing system of claim 1, wherein said flow modulation element comprises a raised feature configured to extend from an upper surface of said substrate holder and configured to introduce said additive process gas in a direction substantially away from said substrate and substantially parallel to said upper surface of said substrate.

11. The processing system of claim 10, wherein said flow modulation element comprises a ring resting on an upper surface of said substrate holder.

12. The processing system of claim 11, wherein said ring is configured to introduce said additive process gas from an outer edge of said ring.

13. The processing system of claim 11, wherein said ring is configured to introduce said additive process gas from an upper surface of said ring.

14. The processing system of claim 1, wherein said additive process gas comprises a substantially the same composition as said process gas.

15. The processing system of claim 1, wherein said additive process gas comprises a different composition than said process gas.

16. The processing system of claim 1, wherein said additive process gas comprises inert gas.

17. The processing system of claim 1, further comprising:
a second flow modulation element coupled to said substrate holder beyond said peripheral edge of said substrate, wherein said second flow modulation element comprises a solid structure tailored to displace a flow of said process gas upward from said upper surface of said substrate and said substrate holder.

18. The processing system of claim 17, further comprising:
a third flow modulation element coupled to said gas distribution system, wherein said third flow modulation element comprises a solid structure tailored to displace said flow of said process gas downward from a lower surface of said gas distribution system.

19. The processing system of claim 1, further comprising:
a gas plenum formed within said substrate holder that receives an additive process gas from a gas distribution passage and distributes the additive process gas to the flow modulation element.

20. The processing system of claim 1, further comprising:
a controller which is programmed to control the flow modulation element to inject said additive process gas such that said flow of said process gas is more uniform than without said flow of additive process gas.

* * * * *

UNITED STATES PATENT AND TRADEMARK OFFICE
CERTIFICATE OF CORRECTION

| | | |
|---|---|---|
| PATENT NO. | : 8,048,226 B2 | Page 1 of 1 |
| APPLICATION NO. | : 11/694312 | |
| DATED | : November 1, 2011 | |
| INVENTOR(S) | : Mirko Vukovic et al. | |

It is certified that error appears in the above-identified patent and that said Letters Patent is hereby corrected as shown below:

On the title page, the Terminal Disclaimer information has been omitted. Item (45) and the Notice information should read as follows:

-- (45) **Date of Patent: *Nov. 1, 2011**

( * ) Notice:   Subject to any disclaimer, the term of this patent is extended or adjusted under 35 U.S.C. 154(b) by 234 days.

This patent is subject to a terminal disclaimer. --

Signed and Sealed this
Third Day of January, 2012

David J. Kappos
*Director of the United States Patent and Trademark Office*